April 2, 1963 W. A. LITTLE ETAL 3,083,441

METHOD FOR FABRICATING TRANSISTORS

Filed April 13, 1959 2 Sheets-Sheet 1

INVENTORS
William A. Little &
Stacy B. Watelski

BY Stevens, Davis, Miller & Mosher
ATTORNEYS

METHOD FOR FABRICATING TRANSISTORS

Filed April 13, 1959 2 Sheets-Sheet 2

INVENTORS
William A. Little &
Stacy B. Watelski
BY Stevens, Davis, Miller & Mosher
ATTORNEYS United States Patent Office 3,083,441
Patented Apr. 2, 1963

3,083,441

METHOD FOR FABRICATING TRANSISTORS

William A. Little, Richardson, and Stacy B. Watelski, Dallas, Tex., assignors to Texas Instruments Incorporated, Dallas, Tex., a corporation of Delaware Filed Apr. 13, 1959, Ser. No. 805,939
6 Claims. (Cl. 29—25.3)

This invention relates to the fabrication of semiconductor signal translating devices and more particularly to diffusion methods for producing transistors.

In the semiconductor art, a region of semiconductor material containing an excess of donor type impurities and hence an excess of free electrons is considered to be an N-type region, while a region containing an excess of acceptor type impurities resulting in a deficit of electrons, or excess of holes, is known as a P-type region. The boundary between the two regions is termed an N-P junction and the specimen of semiconductor material is termed an N-P semiconductor device. Such a specimen is useful as a rectifier. When a semiconductor device is formed with two N-type regions separated by a P-type region, it is termed an N-P-N junction semiconductor device or transistor. Conversely, transistors may be formed with two P-type regions separated by an N-type region which is termed a P-N-P junction transistor. Other combinations are also possible as, for example, by inclusion of a region of intrinsic semiconductor material, having an excess of neither electrons or holes, N-P-I-N and P-N-I-P junction transistors are obtained.

Different methods of forming P-N junctions in semiconductors are known and include alloying or fusion of bodies containing impurities of opposite types, diffusion of an impurity of one type into a semiconductor body having an impurity of the opposite type, and crystal pulling techniques wherein a seed crystal of semiconductor of one conductivity type is slowly withdrawn from a melt of the base semiconductor material whose impurity-type ratio is changed to produce P-N junctions during the growing crystal ingot. All of these methods have advantages and disadvantages but none are particularly adapted to mass produce transistors or rectifiers of adequate quality. The fusion process necessarily is limited to individual device fabrication. Crystal pulling techniques involve relatively slow rates at which the crystal is drawn plus precise controls to regulate the thickness of the base region and to prevent formation of lattice defects in the crystal. Impurity diffusion has been employed to achieve control of doping and dimensions. These, however, have been normally accompanied by troublesome etching and masking practices to delimit the diffused regions. Also, due to the nature and configuration of diffused transistors, it has been difficult to obtain satisfactory contacts to the base region except by the method of alloying or bonding a contact through the emitter layer which covers the base region. By the present invention, base contacts are made directly to the base region and need not touch the emitter region.

Accordingly, it is a primary object of the present invention to provide a diffusion method of producing junction devices more rapidly and in larger quantity than has heretofore been possible in the prior state of the art and which minimizes the need for masking and etching.

Another object of the invention is to provide a diffusion method for producing semiconductor junction devices which is simple and lends itself to mass production thereby lowering the cost of manufacture.

A further object of the invention is to provide a method for fabricating transistors which is accurately controllable to enable the formation of junctions of uniform and reproducible characteristics.

A still further object of the invention is to provide a method of producing a large area ohmic connection on a junction semiconductor device.

A still further object of the invention is to provide a method for producing a transistor having a large emitter area for use in high power applications.

The method of the present invention broadly comprises the steps of forming a plate of semiconductor material of one conductivity type and of a predetermined thickness, diffusing additional impurity of the same conductivity type into one face of the plate; diffusing impurity of the opposite conductivity type into the other face of the plate to form a collector region; forming a series of spaced channels in the first side of the plate which extend to a depth below the impurity diffused into that side of the semiconductor plate; diffusing an impurity of the opposite conductivity type into the floors of the channels to form an emitter region of the same conductivity type as the collector region, and bonding ohmic contact layers to both faces of said plate and to the emitter regions in the channels.

The novel features that are considered characteristic of the invention are set forth with particularity in the appended claims. The invention itself, however, both as to its organization and its method of operation, together with additional objects and advantages thereof, will best be understood from the following description of specific embodiments when read in connection with the accompanying drawings, wherein like reference characters indicate like parts throughout the several figures and in which:

Figure 1:
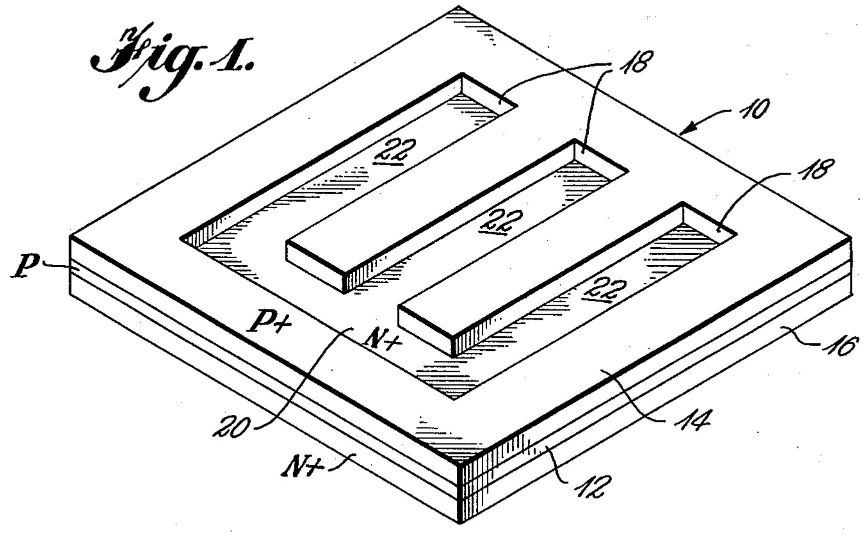
FIG. 1 is a perspective view of a plate of semiconductor material in an intermediate stage of fabrication of junction transistors according to the method of the present invention.

Referring now to the drawings, FIG. 1 shows a plate 10 of semiconductor material in an intermediate state of fabrication under the method according to this invention before the addition of contact layers. The illustrated plate 10 is initially formed of semiconductor material of P-type conductivity into whose opposite faces have been diffused impurities of P and N types to form heavily doped layers 14 and 16 of strongly P-type (P+) and strongly N-type (N+) resistivity, respectively, separated by a layer 12 of the original P-type material. A series of grooves or channels 18, equally spaced and of appropriate width and depth, are then formed in the P+ layer by etching, electroforming, ultrasonic drilling, or the like to yield the proper geometric dimensions for the emitter areas. A connecting channel 20 is formed at one end of channels 18. The configuration and arrangement of these channels may be varied depending upon the size and shape of plate 10 and the characteristics desired of the finished transistors. Donor type impurity material 22 is then diffused into the floors of the channels. The subsequent steps of the process, not illustrated in FIG. 1, include the alloying of contact layers 24, 26 and 28 to both faces of the plate and the emitter areas in the groove floors.

Figure 2:
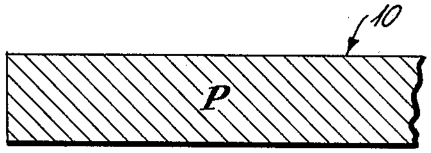
FIGS. 2–6 are sectional schematic diagrams showing a portion of the plate of FIG. 1 in various stages of fabrication.
Figure 3:
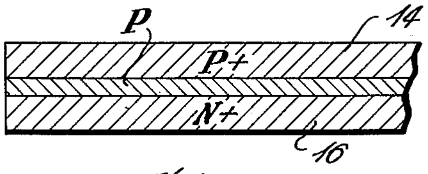
Figure 4:
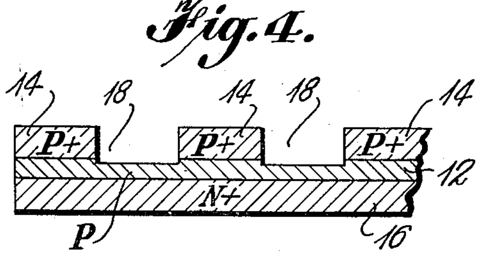

The detailed steps of the process will be more readily understood upon reference to the diagrams of FIGS. 2–6. In the making of N-P-N silicon transistors, for example, a plate 10 of single crystal silicon doped with boron to yield a required resistivity is fashioned to a preferred thickness of about 5–10 mils as indicated in FIG. 2. Diffusion of additional boron or other acceptor material is then carried out for about four hours at approximately 1300° C. to form the P+ layer 14 of FIG. 3. This boron diffusion may be from a coating of boric acid applied to one side of the wafer. The opposite side of the plate is then subjected to diffusion for a like period at about the same or a slightly lower temperature of a donor impurity such as phosphorous. A coating of phosphorous pentoxide on one surface of the wafer may be used as the phosphorous source. If desirable, these two diffusion steps may be carried out simultaneously. This yields the collector region 16, FIG. 3, separated from layer 14 by a thin base region 12 of the original P-type semiconductor material. The base region 12 is preferably in the order of 1–2 mils thick. The grooves 18, FIG. 4, are then formed in plate 10 by means of selective coating, etching, electroforming, ultrasonic drilling, or similar techniques. The spacing and dimensions of the grooves are selected with the desired emitter geometry in mind. The grooves may form a spiral or other geometric shapes rather than the shape shown. The groove depth preferably is made adequate to uncover the semiconductor material of the original P-type at layer 12 to permit formation of an emitter base junction thereto. The dimensions of the grooves 18 will depend on the type of transistor to be made from the plate 10. For example, the plate 10 may be intended ultimately to form a single power transistor in which case the grooves would all be connected together and would be of such configuration to yield a periphery of the length required for the intended purpose. If several smaller transistors are to be made from the plate 10, the grooves may extend all the way to the edges of the plate and need not have connecting grooves between them.

Figure 5:
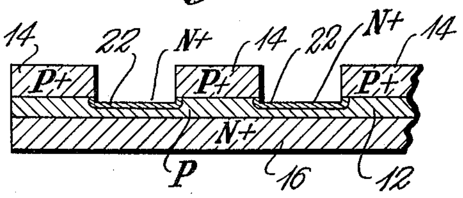

The next step, illustrated in FIG. 5, involves the diffusion of a donor impurity such as phosphorous into the floors of channels 18 to form the emitter areas 22. This may be accomplished by coating the floors of the grooves with phosphorous pentoxide and then baking the plate at 1300° C. for two hours or less to yield a layer 22 in the range of 0.2–1 mil thick. During this diffusion step, the channel lands 14 may be masked in a conventional way, such as by an oxide coating to prevent the impurity from diffusing into the layer 14.

Ohmic contact areas 24, 26 and 28 are then bonded to the exposed surfaces of plate 10. This is preferably done by known alloying techniques using appropriate contact materials such as aluminum, gold-antimony or others. The attachment of the contact areas may be accomplished by other methods known to the art such as evaporation, plating or the like. The final steps of the method are to attach leads and place the unit in a conventional supporting and protecting structure.

FIGS. 7–11 illustrate a modified method for fabricating N-P-I-N silicon transistors. To produce such transistors, the plate 10 is formed of material having a slightly N-type conductivity and a very high resistivity which approaches that of intrinsic silicon material. Of course, compensated (balanced impurity content) or intrinsic silicon may be used for the plate 10. When the acceptor and donor impurities are diffused in the opposite faces to form layers 14 and 16, the separating layer 32 is made thinner and in the range of 0.5–1 mil. Layer 32 is substantially intrinsic silicon and is the I region. Because of the nature of the penetration by diffusion of the N and P type impurities, the layers 14 and 16 will be strongly P and N-type respectively, near the surface of the plate and progressively less strongly P and N-type toward the I region 32.

Channels 18 are formed to extend nearly to the I layer 32, the material at the bottom of the channels 18 being more weakly P-type. P and N-type impurity diffusion sources are then applied to the floors of the channels 18 and the units again baked, for example at about 1300° C. for one to two hours, to form the emitter and base regions 22 and 12*a*, respectively. Phosphorous pentoxide and boric acid may again be used as the impurity diffusion sources. Inasmuch as the boron will diffuse into the silicon wafer at a much faster rate than the phosphorous, as is true of most P-type impurities in silicon, the boron will penetrate the I layer 32 sufficiently to create the P-type base layer 12*a*. The phosphorous will penetrate the wafer more slowly than the boron but will be in sufficient quantity to convert at least a part of the thin P-type layer at the bottom of the channel 18 (see FIG. 9) to N-type material. Subsequently, the contact areas 24, 26 and 28 are bonded to the various regions as described previously and the assembly completed by attaching leads and placing the unit, or units if the plate is cut into several devices, in an appropriate enclosure as is well known in the art.

Figure 6:
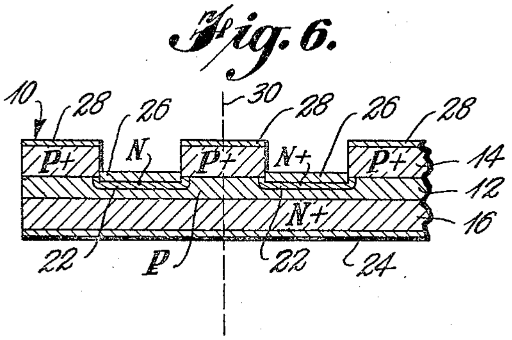
Figure 7:
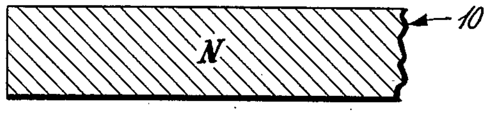
FIGS. 7–11 are diagrams corresponding to FIGS. 2–6 but illustrating a modified method for fabricating junction transistors having an area of intrinsic resistivity separating the base region from the collector region.
Figure 8:
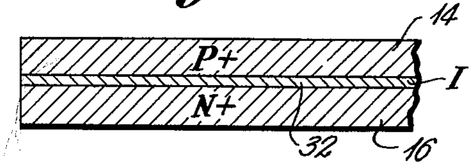
Figure 9:
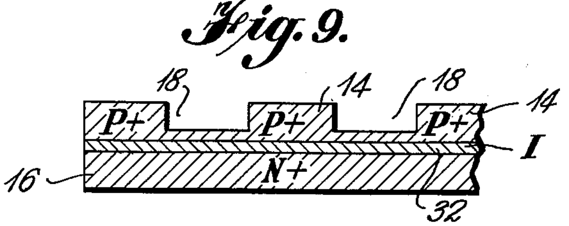
Figure 10:
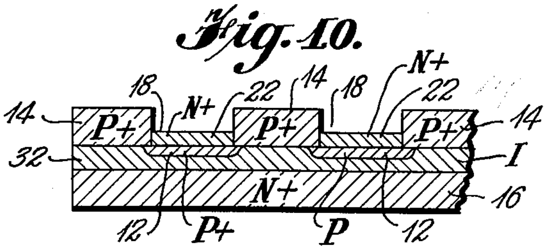
Figure 11:
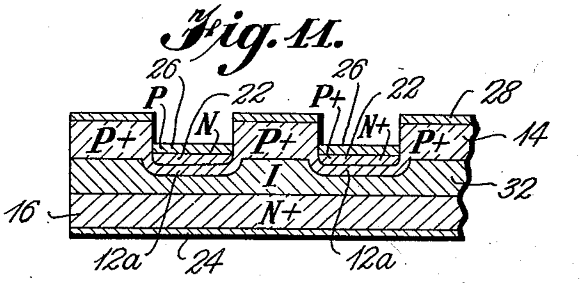

The methods described herein make possible the production of transistors having a large emitter area and hence greater power handling capabilities. Further, the plate 10 may be diced into a multiplicity of separate transistor wafers which are identical and each of which comprises a collector 16, an emitter 22 and a base 12, the base being electrically connected to the contact surfaces 28 by P+ type layers 14. The broken line 30, FIG. 6, illustrates one of the preferred dicing or cutting lines. It will be noted that the resultant wafer includes the emitter 22 centrally located between a pair of lands which include the ohmic contact layers 28 and layers 14 and afford electrical connection from an external lead, not shown, to the base 12. As before, in the final step of the method, leads are affixed to each transistor wafer and the wafer soldered into a conventional supporting and protective structure.

Although the invention has been described with particular reference to the production of N-P-N and N-P-I-N silicon transistors through the use of boron and phosphorous as impurities, it may be practiced also to make P-N-P and P-N-I-P transistors by suitably modifying the process steps to form the appropriate regions in their proper sequence. Furthermore, the method is not limited to the manufacture of silicon transistors, but may be used in making transistors from other semiconductive materials such as germanium. Other impurities of the donor type, such as antimony, or arsenic may be substituted for the phosphorous cited as an example, and other acceptor materials such as aluminum, gallium or indium may be used in place of boron.

Thus there have been described methods for making diffusion transistors which are equally applicable to high or low power transistors. The disclosed methods offer techniques lending themselves quite readily to mass production manufacturing and provide a transistor unit to which contacts, especially the base contacts, are easily affixed without the necessity of resorting to prior art techniques of attaching base contacts to diffusion transistors by alloying or bonding through a portion of the emitter region.

Although certain specific embodiments of the invention have been shown and described, it is obvious that many modifications thereof are possible. The invention, therefore, is not to be restricted except insofar as is necessitated by the prior art and by the scope of the appended claims.

What is claimed is:

1. The method of fabricating a semiconductor element which comprises forming a plate of semiconductive material of one conductivity type, diffusing impurities of opposite conductivity types into opposite faces of said plate, forming a channel in that face of said plate having a diffused layer of the same conductivity type as said plate, and diffusing an impurity of the opposite conductivity type into the floor of said channel to form an emitter layer of the same conductivity type as the diffused region on the unchanneled face of said plate.

2. The method of mass fabricating semiconductor elements which comprises forming a plate of semiconductive material of one conductivity type, diffusing impurities of opposite conductivity types into opposite faces of said plate forming a plurality of channels in that face of said plate having a diffused layer of the same conductivity type as said plate and extending into the plate to uncover the original semiconductive material, diffusing an impurity of the opposite conductivity type into the floors of the channels to form emitter layers of the same conductivity type as the diffused region on the unchanneled face of said plate, alloying ohmic contact layers to the faces of said plate and to the floors of said channels, and dicing said plate to form a multiplicity of junction transistor wafers, each having an emitter region defined by the floor of a portion of the said channel, a collector region defined by a portion of the unchanneled face of said plate and a base region defined by a portion of the lands of said channeled face of the plate.

3. The method of fabricating a semiconductor element which comprises forming a plate of semiconductive material of one conductivity type and from five to ten mils in thickness, diffusing impurities of opposite conductivity types into opposite faces of said plate to a depth of from one to two mils, forming a channel in that face of said plate having a diffused layer of the same conductivity type as said plate and extending beyond said layer to uncover the original semiconductive material, and diffusing an impurity of the opposite conductivity type into the floor of said channel to a depth of from two tenths to one mil to form an emitter layer of the same conductivity type as the diffused region on the unchanneled face of said plate.

4. The method of fabricating a silicon power transistor which comprises forming a plate of crystal silicon containing a donor impurity, diffusing a layer of additional donor impurity into one face, diffusing a layer of acceptor impurity into the opposite face to form a collector region, forming a channel in the first face of said plate to a depth sufficient to uncover the original silicon material containing the donor impurity, and diffusing an acceptor impurity into the floor of said channel to form an emitter region.

5. The method of fabricating a silicon power transistor which comprises forming a plate of crystal silicon containing an acceptor impurity, diffusing additional acceptor impurity into one face, diffusing a layer of donor impurity into the opposite face to form a collector region, forming a channel in the first face of said plate to a depth sufficient to uncover the original silicon material containing the acceptor impurity, and diffusing a donor impurity into the floor of said channel to form an emitter region.

6. The method of fabricating a semiconductor element which comprises forming a plate of intrinsic semiconductor material, diffusing impurities of opposite conductivity types into opposite faces of said plate, forming a channel in one face of said plate of one type conductivity to a depth nearly equal to that of the said one type impurity region in said face, diffusing an impurity of said one conductivity type into the floor of said channel to form a base region, and diffusing an impurity of an opposite conductivity type into said base region to form an emitter region.

References Cited in the file of this patent

UNITED STATES PATENTS

| | | |
|---|---|---|
| 2,689,930 | Hall | Sept. 21, 1954 |
| 2,695,852 | Sparks | Nov. 30, 1954 |
| 2,814,853 | Paskell | Dec. 3, 1957 |
| 2,837,704 | Emeis | June 3, 1958 |